(12) United States Patent
Hyvönen (10) Patent No.: US 7,084,728 B2
(45) Date of Patent: Aug. 1, 2006

(54) ELECTRICALLY DECOUPLED INTEGRATED TRANSFORMER HAVING AT LEAST ONE GROUNDED ELECTRIC SHIELD

(75) Inventor: Lassi Pentti Olavi Hyvönen, Helsinki (FI)

(73) Assignee: Nokia Corporation, Espoo (FI)

( * ) Notice: Subject to any disclaimer, the term of this patent is extended or adjusted under 35 U.S.C. 154(b) by 54 days.

(21) Appl. No.: 10/736,809

(22) Filed: Dec. 15, 2003

(65) Prior Publication Data

US 2005/0128038 A1   Jun. 16, 2005

(51) Int. Cl.
*H01F 27/36* (2006.01)

(52) U.S. Cl. .................... 336/84 C; 336/200
(58) Field of Classification Search .......... 336/83 R, 336/84 C, 200, 232; 257/531
See application file for complete search history.

(56) References Cited

U.S. PATENT DOCUMENTS

| | | | | |
|---|---|---|---|---|
| 5,150,046 | A | | 9/1992 | Lim .......................... 323/356 |
| 5,598,327 | A | * | 1/1997 | Somerville et al. .......... 363/131 |
| 5,877,667 | A | | 3/1999 | Wollesen .................... 336/200 |
| 6,031,445 | A | | 2/2000 | Marty et al. ................ 336/200 |
| 6,420,952 | B1 | * | 7/2002 | Redilla ..................... 336/84 M |
| 6,580,334 | B1 | | 6/2003 | Simburger et al. ........ 333/24 R |
| 6,593,838 | B1 | * | 7/2003 | Yue ........................... 336/84 C |
| 6,756,656 | B1 | * | 6/2004 | Lowther ...................... 257/531 |
| 2001/0050607 | A1 | | 12/2001 | Gardner ..................... 336/200 |
| 2003/0001713 | A1 | | 1/2003 | Gardner ..................... 336/200 |
| 2003/0030534 | A1 | | 2/2003 | Gu et al. .................... 336/221 |
| 2003/0071706 | A1 | | 4/2003 | Christensen ................ 336/200 |

OTHER PUBLICATIONS

"Analytical Modeling and Characterization of Deep-Submicrometer Interconnect", Sylvester, Dennis, Proceedings Of the IEEE, vol. 89, No. 5, May 2001, pp. 634-664.

* cited by examiner

*Primary Examiner*—Tuyen T Nguyen
(74) *Attorney, Agent, or Firm*—Harrington & Smith, LLP

(57) ABSTRACT

An integrated circuit, such as a radio frequency integrated circuit (RFIC), has a first layer bearing first metallization patterned for defining a first inductive coil, a second layer bearing second metallization patterned for defining a second inductive coil that overlies the first inductive coil and that is magnetically coupled to the first inductive coil through a third layer interposed between the first layer and the second layer. The third layer bears third metallization for defining an electric shield or electrostatic shield. The third metallization is patterned into a plurality of structures having shapes intended to minimize eddy currents. The electric shield is connected to further metallization that carries a ground potential. The third layer may further bear other metallization for coupling together at least two components of the integrated circuit. The integrated circuit may be fabricated by a CMOS process, and the first and second coils may be a primary coil and a secondary coil, respectively, of a radio frequency transformer. An additional electric shield may also be included, and in this case one electric shield can be coupled to a ground potential associated with the primary coil, and the second electric shield can be coupled to a ground potential associated with the secondary coil.

28 Claims, 10 Drawing Sheets

PART OF RFIC

(a) NO SUBSTRATE GROUND (NG)

(b) HALO GROUND CONTACT (HG)

(c) CROSS BAR PATTERN (CBP)

(d) WIDE BAR PATTERN (WBP)

(e) NARROW BAR PATTERN (NBP*)
(CLOSE-LOOP RING CONTACT)

(f) PERFORATED GROUND PLATE (PG*)
(CLOSE-LOOP RING CONTACT)

(g) SOLID GROUND PLATE (SG)

FIG. 13
PART OF RFIC

ELECTRICALLY DECOUPLED INTEGRATED TRANSFORMER HAVING AT LEAST ONE GROUNDED ELECTRIC SHIELD

TECHNICAL FIELD

This invention relates generally to magnetically coupled electrical devices and, more specifically, relates to multi-winding transformers that are fabricated as part of an integrated circuit.

BACKGROUND

The use of an electric shield, also referred to as an electrostatic shield, between primary and secondary coils or windings is well known in the art, such as in power supply and telecommunications applications. An electric shield can be used to prevent a high voltage breakdown from the primary winding to the secondary winding. For example, in the case of the presence of lightning impulse voltage the electric shield conducts the breakdown to ground. An electric shield can also be used to attenuate electrical noise that would otherwise be coupled between the primary and secondary windings.

Figure 1A:
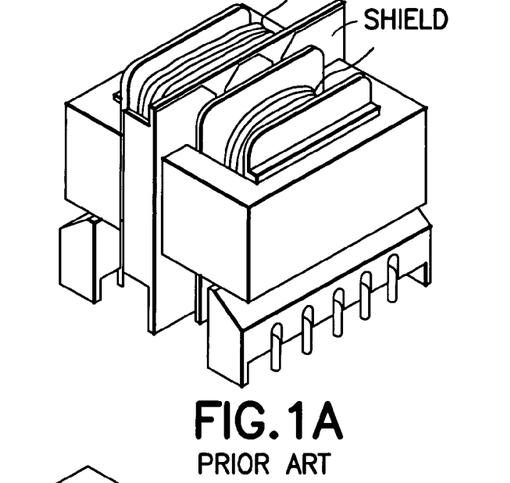
Figure 1B:
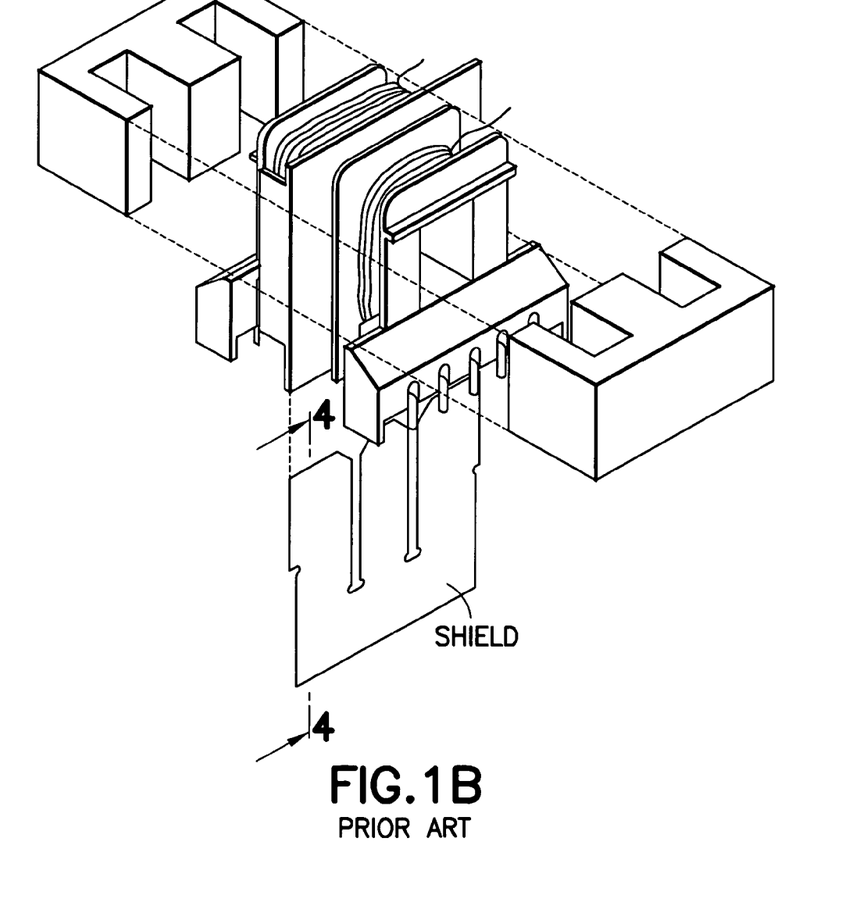
Figure 2:
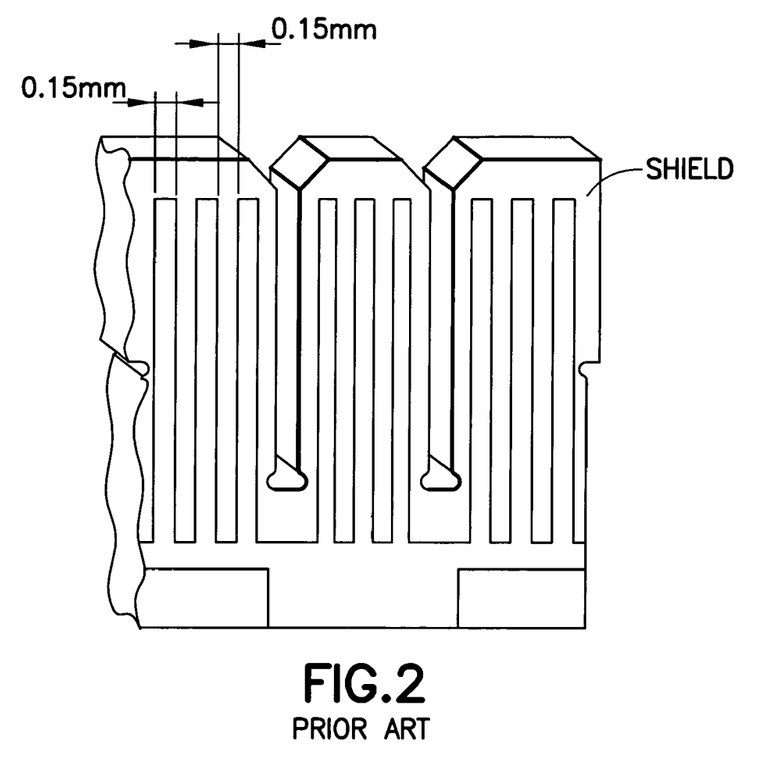
FIG. 2 shows the electric shield of FIG. 1 in greater detail.

FIG. 1 shows an elevational view (1A) and an exploded view (1B) of a conventional iron core transformer that has an electric shield, as shown and described in US 2003/0030534 A1, "Transformer Shielding", Gu et al. FIG. 2 shows the electric shield of FIG. 1 in greater detail. Note that the shield is not provided as a continuous sheet of metal, but instead contains a number of cut-out areas forming a comb-type pattern of parallel, electrically conductive traces connected together on one end by a connecting trace. The purpose of using the comb-type shape is to prevent the formation of eddy currents. The presence of eddy currents is disadvantageous, as they increase the losses that occur between the primary and the secondary windings.

Figure 3:
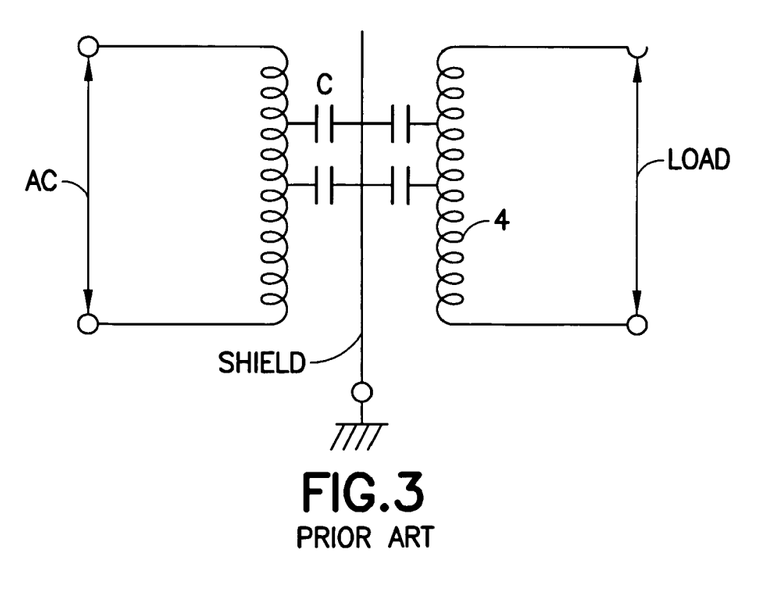
FIG. 3 depicts an equivalent circuit of a conventional noise-shielded transformer.

FIG. 3 depicts an equivalent circuit of a conventional noise-shielded transformer, such as one shown in U.S. Pat. No. 5,150,046. The shield is shown as being connected to circuit ground. During operation the high frequency magnetic flux in the primary winding, generated by pulse noise, is minimized by being directed to ground through the static capacitance C of the shield winding It is known to use an electric shield under a planar integrated inductor. The electric shield in this case is typically referred to in the literature as a ground shield. The purpose of the ground shield is to prevent noise coupling from a conductive substrate (e.g., bulk silicon). Another purpose of the ground shield is to increase the quality (Q) factor of the inductor, as the lossy ground capacitance is reduced by the presence of the electric shield.

Figure 4:
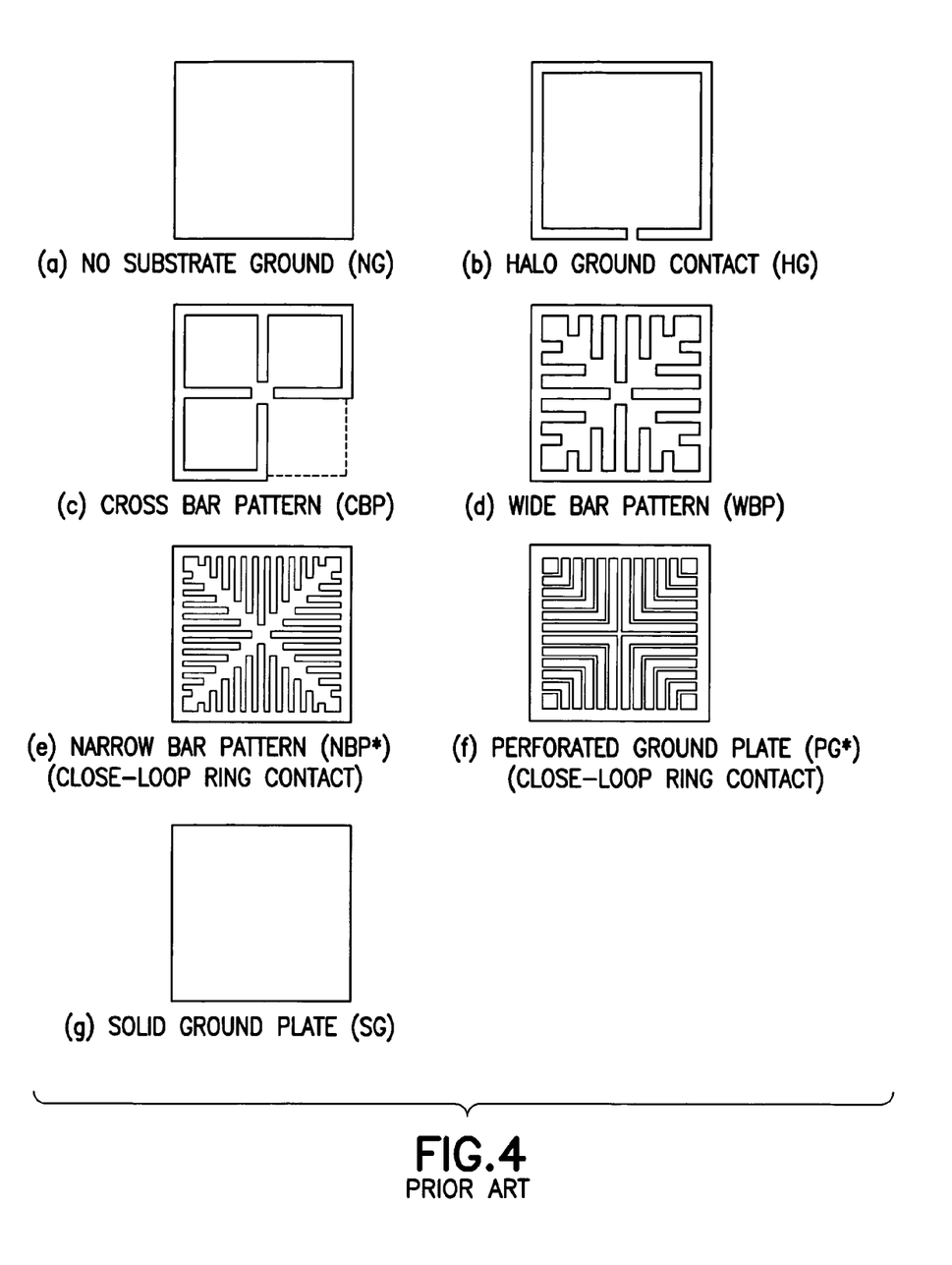

FIGS. 4A–4G, collectively referred to as FIG. 4, show plan view schematics of different conventional metal ground shield structures (FIGS. 4C–4F), in comparison to a floating and a grounded silicon substrate shown in FIGS. 4A and 4B, respectively, and to a solid metal ground plate shown in FIG. 4G. Reference can also be made to: "Progress in RF inductors on silicon-understanding substrate losses", Burghartz, IEEE IEDM'98, pp. 523–526.

Figure 5:
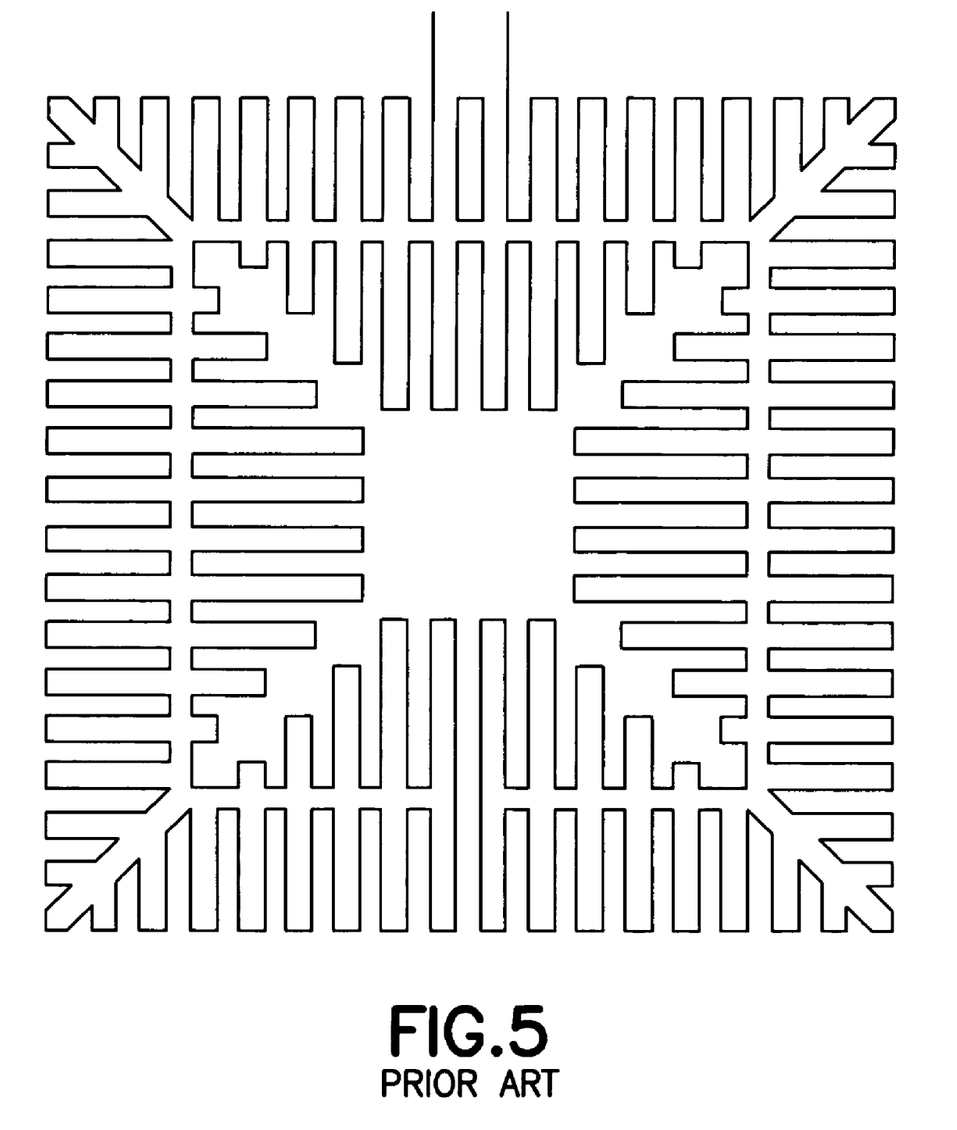
FIG. 5 shows an example of a ground shield that can be placed under a planar inductor or a transformer.

FIG. 5 shows an example of a ground shield that can be placed under a planar inductor or a transformer. Reference in this regard can be made to FIG. 7 of commonly assigned US 2003/0071706 A1, "Planar Transformers", by Christensen. In this case an integrated transformer is disposed over the patterned ground shield. The ground shield comprises an array of generally radially extending fingers connected by a broken ring. The broken ring is positioned some distance inwardly from the outer periphery of the ground shield, in a region where the transformer's magnetic field is parallel to the surface of the substrate on which the transformer is formed. Positioning the connecting ring in this way is said to reduce the series resistance of the shield, when compared with a similar shield with a peripherally-disposed connecting ring.

Also of interest is US 2003/0001713, "Integrated Transformer", by Gardner. In this US Patent a structure is disclosed to include magnetic layers, and thus would have a ferrite core which acts to strengthen the magnetic coupling. The magnetic layer is slotted radially, i.e. perpendicular to the windings, and the slots are used to reduce eddy currents. In this approach, however, the magnetic layers are not disclosed to be used as an electric shield, but simply as a magnetic core.

In US2001/0050607 A1, "Integrated Transformer", Gardner, a structure is baked from dielectric, magnetic and conducting layers. The magnetic layer is composed of an amorphous cobalt alloy, and as such the structure has a ferrite core. An electric shield is not disclosed as forming part of the structure.

In U.S. Pat. No. 6,580,334 B2, "Monolithically Integrated Transformer", Simbürger et al. disclose a transformer that is said to be produced according to standard silicon bipolar technology with three metallic layers. The transformer is not disclosed to contain an electric shield.

In U.S. Pat. No. 5,877,667, "On-Chip Transformers", Wollensen discloses embodiments of transformers constructed in separate metal layers in an insulator that serves as a dielectric. The insulator layer is formed on a silicon substrate. The use of an electric shield is not disclosed.

In U.S. Pat. No. 6,031,445, "Transformer for Integrated Circuits", Marty et al. disclose a transformer constructed from four layers of conductive lines separated by insulating layers. The transformer structure does not include an electric shield.

Figure 6:
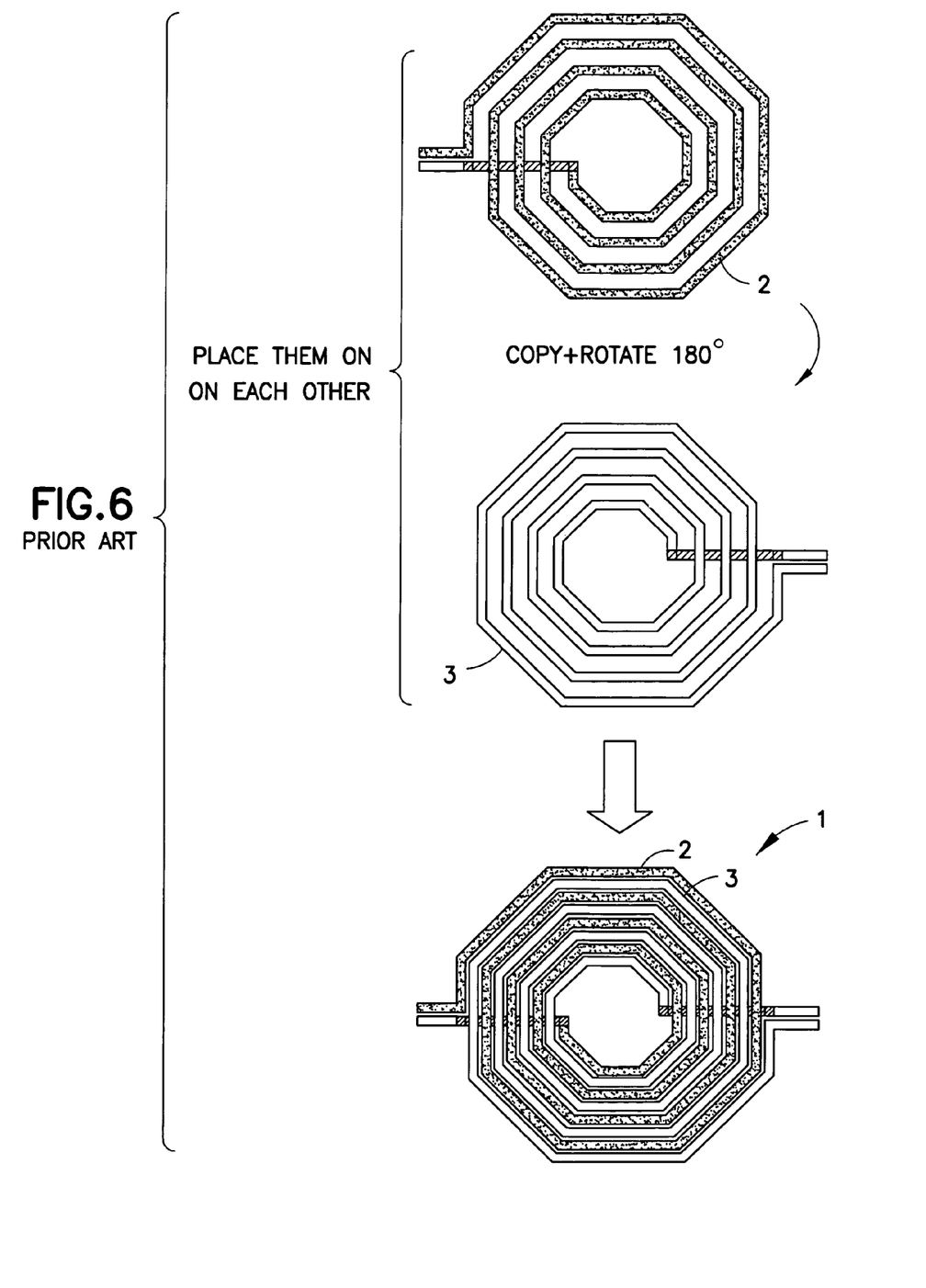
FIG. 6 shows an example of a conventional planar 1:1 interwound transformer with the primary and secondary coils on the same layer.
Figure 7:
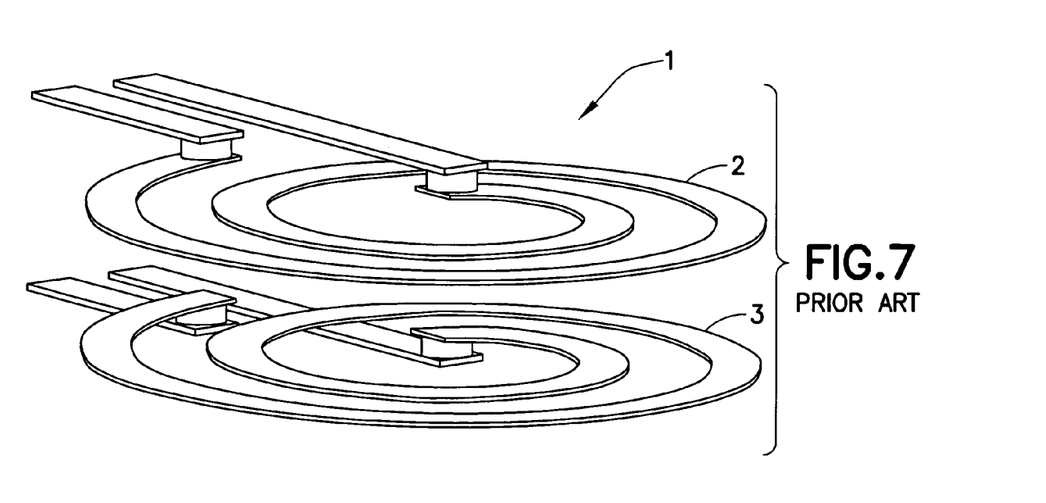
FIG. 7 shows an example of a conventional planar transformer with the primary and secondary coils on different layers.
Figure 8:
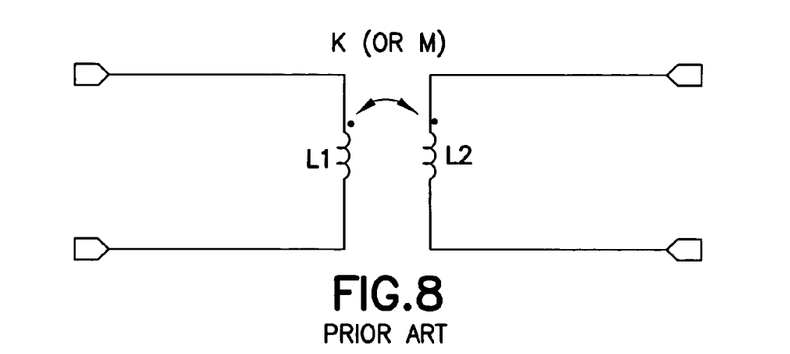
FIG. 8 shows a schematic diagram of a transformer as two-mutually-coupled inductors (L1, L2) having an ideal coupling ratio of unity.

Of most interest to this invention are integrated planar transformers. A planar, integrated transformer 1, or a balun, is basically two planar coils 2 and 3 inter-wound on the same layer (FIG. 6) or on different layers (FIG. 7). The transformer 1 may be considered to be two-mutually-coupled inductors (L1, L2), as shown in FIG. 8. The inductors L1, L2 are coupled to each other with a coupling factor K. An ideal 1:1 transformer 1 has a coupling factor of K=1, while when the coupling is not perfect the coupling factor is less than unity. Mutual inductance is another way to represent the inductive coupling, and corresponds to the coupling factor in the form $M=K(sqrroot(L_1 L_2))$.

Figure 9:
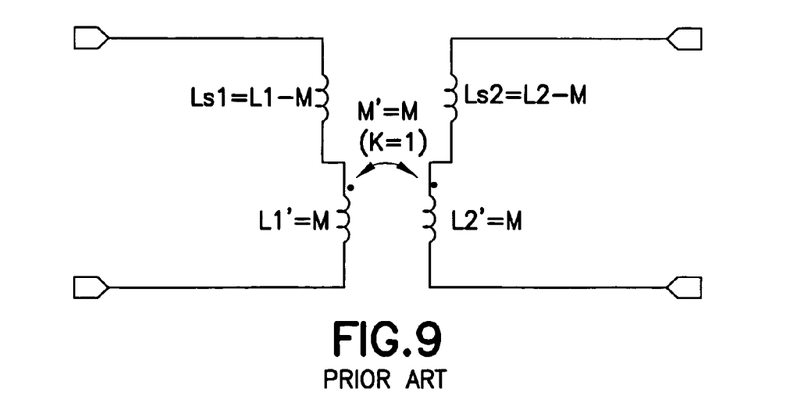
FIG. 9 shows an equivalent presentation of the diagram of FIG. 8, in which a pair of mutual inductances are coupled perfectly to each other, and serial inductances Ls1 and Ls2 considered to be uncoupled from one another are added in series with the inductances L1' and L2' of the ideal transformer.

Considering the effect of K less than unity, the circuit can be shown as in FIG. 9 in an equivalent presentation, in which a pair of mutual inductances with an inductance equal to the original M are coupled perfectly to each other, i.e., K=1. In addition, serial inductances Ls1 and Ls2, having values L-M, are considered to be uncoupled from one another, and are added in series with the inductances L1' and L2' of the ideal transformer.

In addition to the non-perfect inductive coupling the integrated transformer has capacitance between the primary to the secondary coils.

From the circuit design point of view it would be advantageous to construct a transformer with a high K and negligible capacitance between the primary and the secondary coils. In practice, however, the effect of the low K changes the function of the circuit from a transformer to one resembling a serial-shunt-serial inductance circuit. While such a circuit can be matched (with some difficulty), it typically exhibits a narrowband frequency response. The inherent capacitance can also be significant and may cause, for example, common mode leakage through the transformer. When a transformer is used as a balun the capacitance between the primary and secondary windings can result in an asymmetry in the impedance as seen from the balanced port.

Further, in order to improve a planar integrated transformer in accordance with the prior art could require that magnetic core material be somehow added. As can be appreciated, this would result in additional and possibly non-standard process steps, and would result in increased cost and complexity, and possibly in reduced yield.

Based on the foregoing representative sampling of the art and related discussion, it can be appreciated that a need exists for a transformer that can be constructed using electrically conductive elements disposed in layers of an integrated circuit, and that further includes an electric shield disposed between windings to provide the benefits that accrue from the use of the electric shield. Prior to this invention, this need was not satisfied.

SUMMARY OF THE PREFERRED EMBODIMENTS

The foregoing and other problems are overcome, and other advantages are realized, in accordance with the presently preferred embodiments of these teachings.

In one aspect this invention provides an integrated circuit having a first layer bearing first metallization patterned for defining a first inductive coil, a second layer bearing second metallization patterned for defining a second inductive coil that overlies the first inductive coil and that is magnetically coupled to the first inductive coil through a third layer interposed between the first layer and the second layer. The third layer bears third metallization for defining an electric shield or electrostatic shield, and the third metallization is patterned into a plurality of structures having shapes intended to minimize eddy currents. The electric shield is connected to further metallization that carries a ground potential. The third layer may further bear other metallization for coupling together at least two components of the integrated circuit. The integrated circuit may be fabricated by a CMOS process, and the first and second coils may be a primary coil and a secondary coil, respectively, of a radio frequency transformer. Other processes, such as a BiCMOS process, could also be used to realize the benefits of this invention.

There may also be a fourth layer interposed between the first layer and the second layer, where the fourth layer bears fourth metallization for defining a second electrostatic shield. The fourth metallization is also patterned into a plurality of structures having shapes intended to minimize eddy currents, and is connected to still further metallization that also carries ground potential. The first electrostatic shield may be coupled to a ground potential associated with the primary coil, and the second electrostatic shield may be coupled to a ground potential associated with the secondary coil.

This invention also provides a method to construct a planar transformer in an integrated circuit, and includes: fabricating a first layer bearing first metallization patterned for defining a first inductive coil; fabricating a second layer over the first layer, the second layer bearing second metallization for defining an electric shield, the second metallization being patterned into a plurality of structures having shapes intended to minimize eddy currents, where fabricating the second layer comprises fabricating an electrical connection for coupling the electric shield to a ground potential; and fabricating a third layer over the second layer, the third layer bearing third metallization patterned for defining a second inductive coil that overlies the first inductive coil and that is magnetically coupled to the first inductive coil through the electric shield. Fabricating the second layer may include providing additional metallization associated with other circuitry so that the second layer metallization is shared between forming the electric shield and interconnects and possibly other structures for related or unrelated circuitry. As one example, additional electric shields for other planar transformers can be formed using the second layer.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 1 shows an elevational view (1A) and an exploded view (1B) of a conventional iron core transformer that has an electric shield;

FIGS. 4A–4G, collectively referred to as FIG. 4, show plan view schematics of different conventional metal ground shield structures (FIGS. 4C–4F), in comparison to a floating and a grounded silicon substrate shown in FIGS. 4A and 4B, respectively, and to a solid metal ground plate shown in FIG. 4G;

DETAILED DESCRIPTION OF THE PREFERRED EMBODIMENTS

By way of introduction, this invention has grown out of an appreciation by the inventor that one of the current trends in integration of RF circuits is CMOS technology, where a main driver for the use of RF CMOS technology is cost reduction. A typical state of the art CMOS back-end process includes several metal layers used primarily for the wiring of the digital circuitry. An example of the use of multiple metal layers for on-chip interconnects can be found in the literature in, as but one example, a publication entitled: "Analytical Modeling and Characterization of Deep-Submicrometer Interconnect", D. Sylvester and C. Hu, Proceedings of the IEEE, Vol. 89, No. 5, May 2001. FIG. 1 of this publication shows an example of a modem backend process. The number of metal layers in future CMOS processes can be expected to increase as the chip size and transistor density per area increase. The metal layers are formed on or in high quality dielectric layers, such as $SiO_2$ layers.

This invention provides an integrated transformer that is constructed to have an electric shield between the primary and the secondary coils to separate the coils electrically, while still enabling very strong magnetic coupling between the primary and secondary coils. The invention takes advantage of the many metal layers offered in a modem CMOS integrated circuit (IC) fabrication processes, although is not limited for use only with CMOS-based IC processes.

Figure 10A:
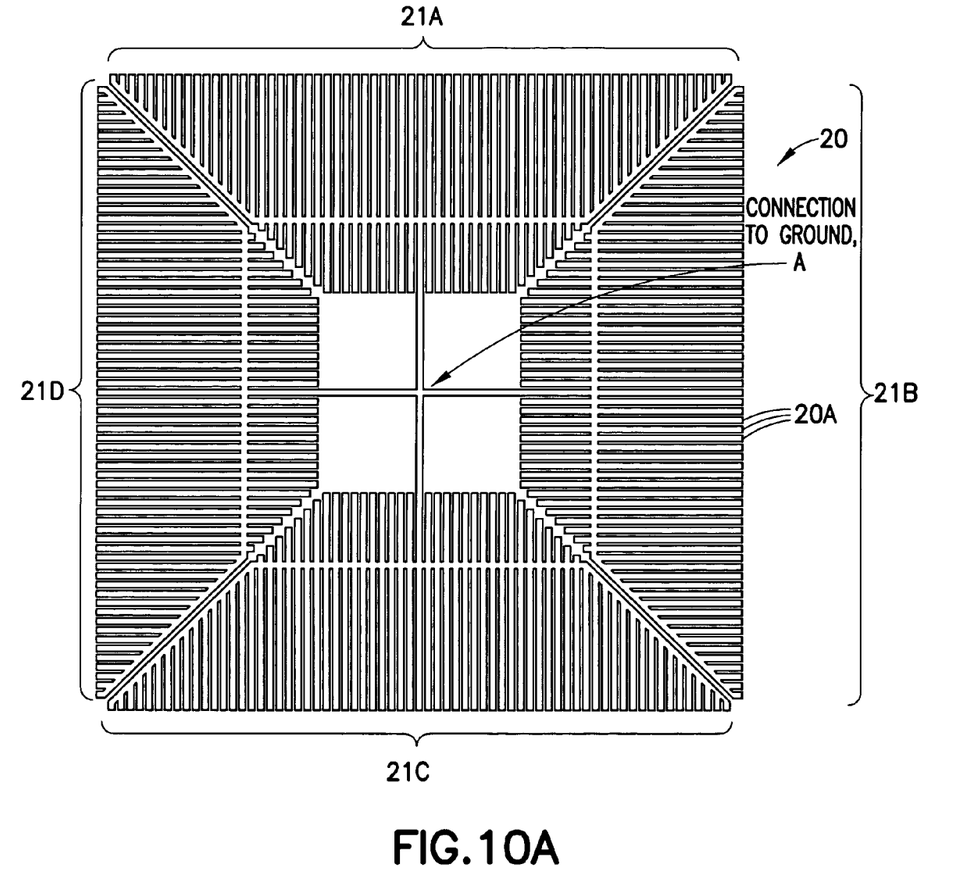
FIGS. 10A, 10B and 10C, collectively referred to as FIG. 10, each show a top, enlarged view of electric shield metallization in accordance with different embodiments of this invention.

Referring to FIG. 10, in accordance with an embodiment of this invention the primary coil and the secondary coil of the transformer are placed over one another on different layers and between them is a layer where a radial-cut metal shield 20 is placed. The graphic symbol of a transformer with an electric shield between coils is presented in FIG. 11, where the shield 20 is shown connected to the ground. Ideally the shield 20 connects the capacitance between the primary and secondary coils to ground, and prevents or significantly reduces capacitive coupling between the primary and secondary coils. However, the magnetic coupling between the primary and secondary coils (L1 and L2 in FIG. 11) remains strong, since the primary and the secondary coils are still physically very close to one another, despite the intervening electric shield 20 metallization layer.

In the preferred embodiment the electric shield 20 is formed from a plurality of radially disposed metal ribbons 20A to avoid eddy currents being created in the electric shield 20. The ribbons 20A are formed in groups, such as the four groups 21A, 21B, 21C and 21D (collectively referred to as 21) shown in FIG. 10A, which are connected together, and to ground, preferably at about the physical center (marked as A in FIG. 10A) of the overlying and underlying transformer coils (not shown in FIG. 10). The connections between ribbons 20A and the groups of ribbons 21 are made in such a way as to avoid the formation of a loop of the ribbons 20A, and to thereby avoid the formation of undesirable eddy currents.

Figure 10B:
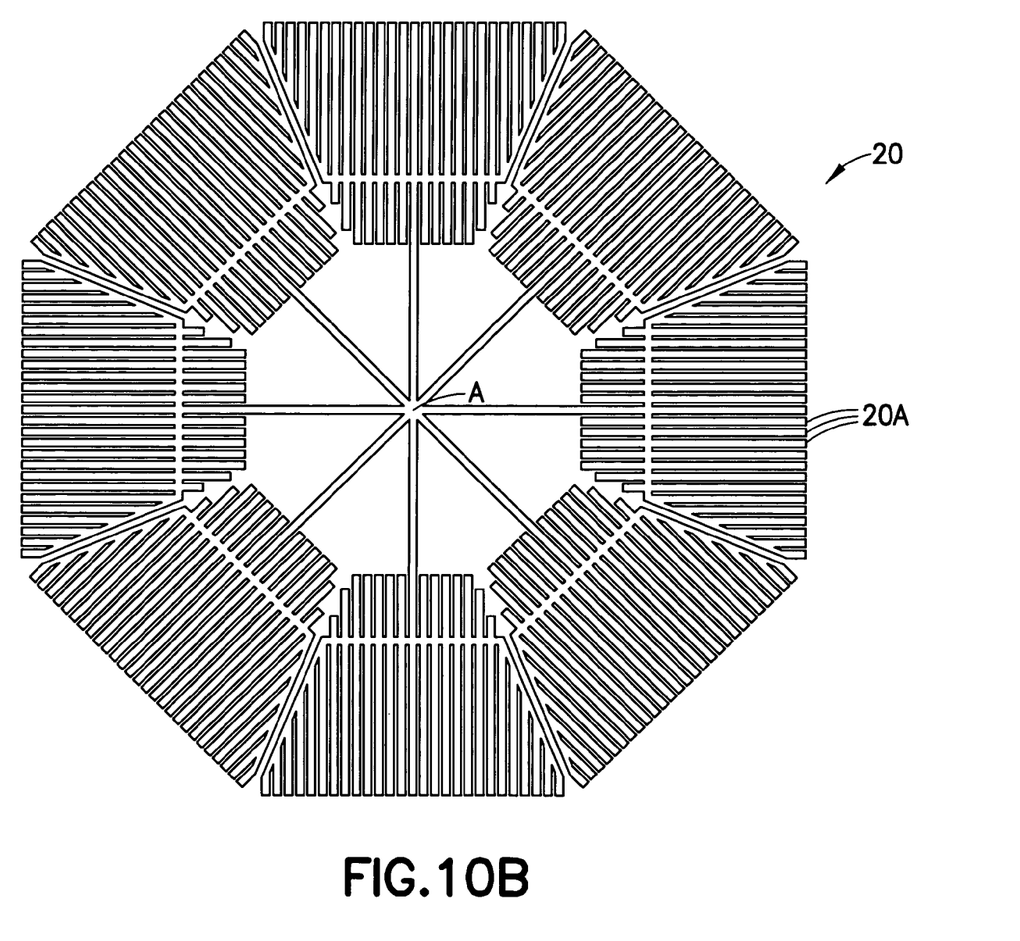
Figure 10C:
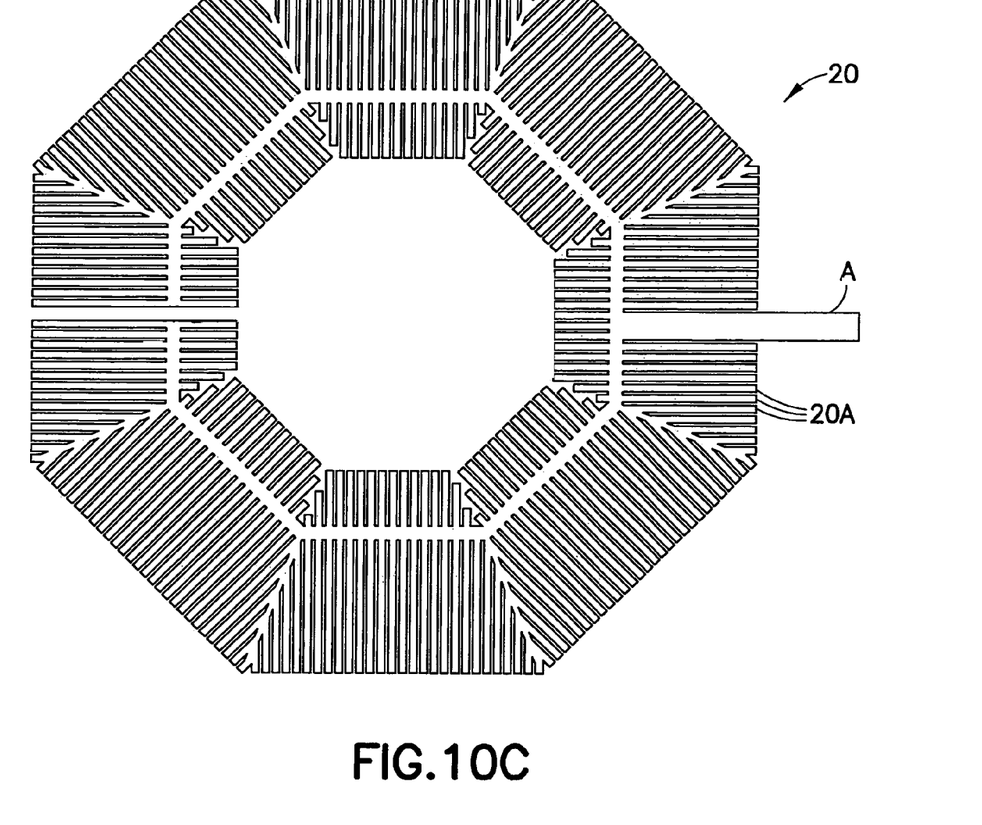
Figure 11:
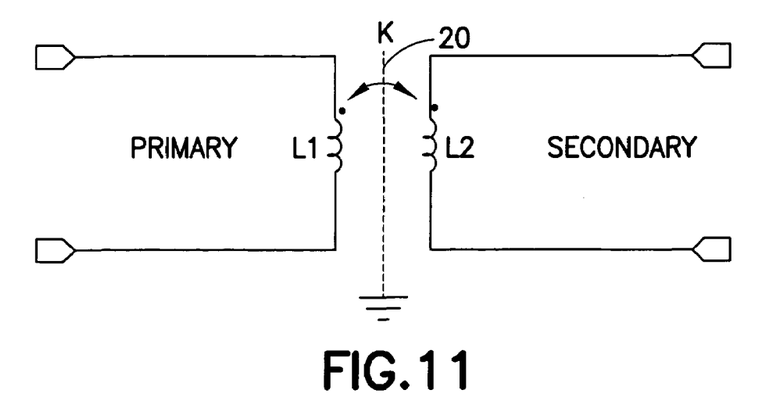
FIG. 11 depicts a graphic symbol of a transformer with the electric shield of FIG. 10 between the primary and secondary coils, where the electric shield is shown connected to ground.

FIGS. 10B and 10C show exemplary octagonal embodiments of the shield 20 (hexagonal and other polyhedral shapes are also within the scope of this invention). Note that in the embodiment of FIG. 10B the ground connection A is also made at about the center of the shield 20, whereas in the embodiment of FIG. 10C the ground connection A is made external to the shield 20.

As a general guideline the width of a single ribbon 20B is not more than twice the skin depth in the metal used in the IC layer in which the electric shield 20 is formed, and the distance between two adjacent ribbons 20A is less than the distance from the primary coil to the secondary coil. Relatedly, it is preferred that the width of the ribbon 20A is of the same order as the width of the gap between ribbons 20A. Note that the skin depth need not be equivalent to the physical thickness of the metal, but is instead the depth into the metal layer that the high frequency RF energy propagates.

As but one non-limiting example, assume that the skin depth for copper at 2 GHz is about 1.5 microns, and assume the use of a conventional CMOS backend process. In this case the distance from a metal layer to the second next layer is about 1.15 microns. Based on these parameters the width (W) of a single ribbon 20A may be about 1 micron, and the distance between two adjacent ribbons 20A may be about 0.5 micron.

In the preferred embodiment of this invention the electrically conductive material, typically a metal, that forms the electric shield 20 is a non-ferrous metal or metal alloy. For example, it could be copper, or aluminum, or gold, or silver, or mixtures, alloys or multi-layered films thereof, as may be conventionally used in the integrated circuit fabrication art for forming electrically conductive interconnects.

However, in other embodiments of this invention the use of electrically conductive non-metals may be used in whole or in part, such as doped polysilicon, so long as the electrical conductivity is sufficiently high so as to provide a good quality electric shield, and the selected electrically conductive material is compatible with the IC process that is being used.

It may be the case that the grounding of the shield 20 is not perfect, and that some residual inductance from the shield 20 to ground remains. As can be appreciated, this makes the choice of the grounding configuration important. In accordance with a further aspect of this invention, and referring to FIG. 12, more than one electric shield 20 can be disposed between the primary and secondary coils L1 and L2, respectively. Assuming as an example the use of two shields 20 and 20', the shield closer to the primary coil L1 is connected to the ground (G1) used in the circuit connecting to the primary coil L1, and similarly the second shield 20' (the one closer to the secondary coil L2) is connected to the ground (G2) used in the circuit connected to the secondary coil L2. While noise may still exist in the shields 20 and 20', the coupling of the noise between the primary coil L1 and the secondary coil L2 is reduced in strength because of the formation of the effective series capacitance connections between the primary and secondary coils.

Figure 12:
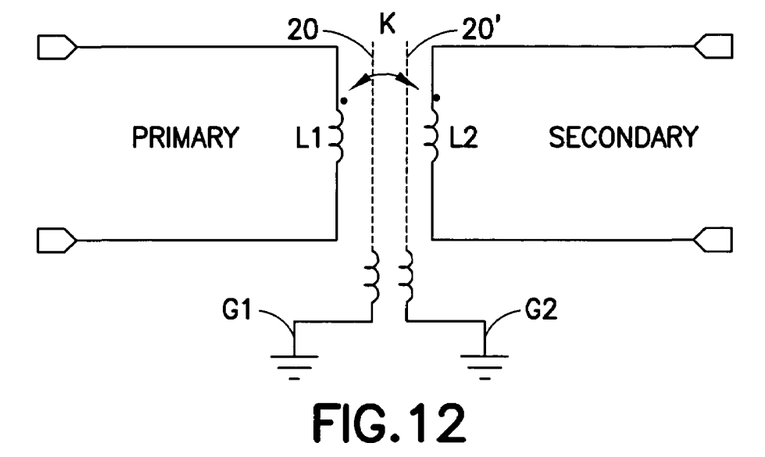
FIG. 12 depicts a graphic symbol of a transformer having more than one electric shield can be disposed between the primary and secondary coils, where the electric shield closer to the primary coil may be connected to a ground used in the circuit connecting to the primary coil, and where the electric shield closer to the secondary coil may be connected to a ground used in the circuit connected to the secondary coil.

It can be noted that the use of this invention effectively enhances the strength of the magnetic coupling between the primary coil and the secondary coil. This is true because the presence of the shield 20, or the shields 20 and 20', significantly reduces the inter-coil capacitance, thereby enabling the two coils to be placed closer to one another than could be done in the prior art (without suffering from undesirable increased noise coupling), which in turn strengthens the magnetic coupling between the primary and the secondary coils L1 and L2.

Figure 13:
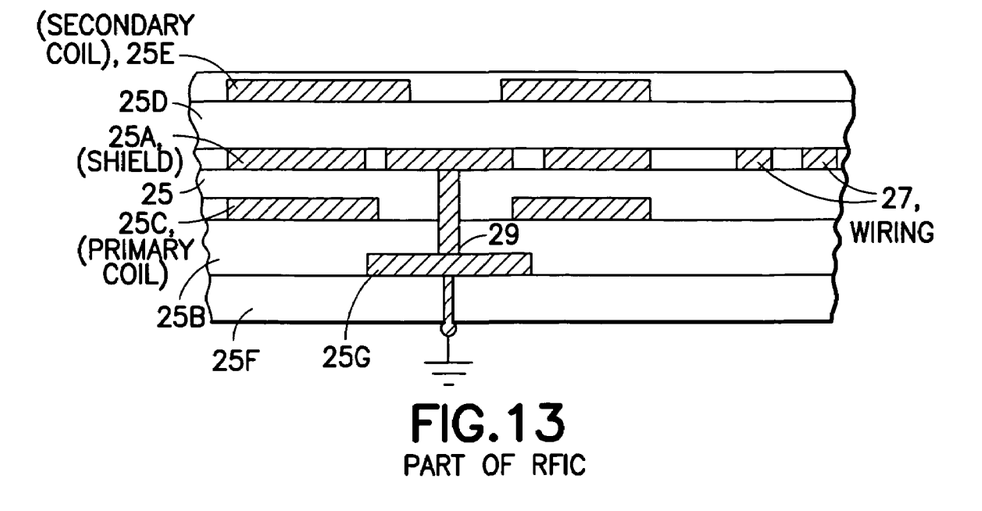
FIG. 13 is an enlarged, cross-section view of an integrated circuit constructed to have a planar transformer having a grounded electric shield disposed between the primary and secondary coils.

Referring now to FIG. 13, a further advantage of this invention is that a layer 25 that bears the shield 20 metallization 25A, and which lies between the layer 25B that bears the primary coil metallization 25C and the layer 25D that bears the secondary coil metallization 25E, can be used as well for other purposes, such as providing wiring 27 between other circuits in the IC. These other circuits could be related to the transformer circuit, or they could be unrelated to the transformer circuit. In this non-limiting example a via 29 is shown for connecting the shield 20 metallization to a desired ground potential, shown as a ground potential carried by further metallization 25G disposed on a further IC layer 25F. FIG. 13 can be considered to show in cross-section a part of an RFIC that is fabricated using a multi-metal layer CMOS process, or any other suitable IC process.

It should be noted that the RFIC could contain a plurality of transformers, and that the layer 25 could bear the shield metallization for each of the plurality of transformers. The layer 25 may also optionally carry wiring/interconnects that is related to one or more of the plurality of transformers, or that is unrelated to any of the plurality of transformers. It should be further noted that in the presently preferred embodiments of this invention the shield 20 can be implemented without adding any process steps to the RFIC fabrication process.

Also, in that the majority of transformers are of the balanced type, the shielding in accordance with this invention can be used to improve the symmetry of the balanced transformer.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other different, similar or equivalent IC processes, types of metallization or other electrically conductive materials, dimensions and the like may be attempted by those skilled in the art. However, all such and similar modifications of the teachings of this invention will still fall within the scope of this invention.

Furthermore, some of the features of the present invention could be used to advantage without the corresponding use of other features. As such, the foregoing description should be considered as merely illustrative of the principles of the present invention, and not in limitation thereof.

What is claimed is:

1. An integrated circuit comprising a first layer bearing first metallization patterned for defining a first inductive coil, a second layer bearing second metallization patterned for defining a second inductive coil that overlies the first inductive coil and that is magnetically coupled to the first inductive coil through a third layer interposed between the first layer and the second layer, said third layer bearing third metallization for defining an electric shield, the third metallization being patterned into a plurality of structures having shapes intended to minimize eddy currents and being connected to further metallization that carries a ground potential.

2. An integrated circuit as in claim 1, where said third layer further bears other metallization for coupling together at least two components of said integrated circuit.

3. An integrated circuit as in claim 1, where said electric shield is patterned to form a plurality of ribbon structures, each ribbon having a width that is a function of a frequency of an electrical signal that is applied to said first inductive coil.

4. An integrated circuit as in claim 1, where said electric shield is patterned to form a plurality of ribbon structures, each ribbon being spaced apart from an adjacent ribbon by a distance that is a function of a distance between said first metallization and said second metallization.

5. An integrated circuit as in claim 1, where said electric shield is patterned to form a plurality of ribbon structures, each ribbon having a width that is a function of a frequency of an electrical signal that is applied to said first inductive coil and each ribbon being spaced apart from an adjacent ribbon by a distance that is a function of a distance between said first metallization and said second metallization.

6. An integrated circuit as in claim 1, where said electric shield is patterned to form a plurality of groups of ribbon structures, within each group the ribbon structures being electrically connected together at one point, and each group being electrically connected together at one point for being connected to the further metallization that carries the ground potential.

7. An integrated circuit as in claim 6, where each group of ribbon structures is electrically connected together at a point located at about a center of the patterning of the first and second metallizations.

8. An integrated circuit as in claim 1, further comprising a fourth layer interposed between the first layer and the second layer, said fourth layer bearing fourth metallization for defining a second electric shield, the fourth metallization also being patterned into a plurality of structures having shapes intended to minimize eddy currents and being connected to still further metallization that carries a ground potential.

9. An integrated circuit as in claim 8, where the further metallization that carries the ground potential carries a ground potential associated with said first inductive coil, and where the still further metallization that carries the ground potential carries a ground potential associated with said second inductive coil.

10. An integrated circuit as in claim 1, where the third metal is a non-ferrous metal.

11. A radio frequency integrated circuit (RFIC) comprising a first layer bearing first metallization patterned for defining a primary coil of at least one transformer, a second layer bearing second metallization patterned for defining a secondary coil of the at least one transformer, one of the primary or the secondary coil overlying the other one of the secondary or primary coil and being magnetically coupled thereto through a third layer interposed between the first layer and the second layer, said third layer bearing third metallization for defining an electrostatic shield for the at least one transformer, the third metallization being patterned into a plurality of structures having shapes intended to minimize eddy currents and being connected to further metallization that carries a ground potential, where said third layer further bears other metallization for coupling together at least two components of said RFIC.

12. An RFIC as in claim 11, where said electrostatic shield is patterned to form a plurality of ribbon structures, each ribbon having a width that is a function of the RF frequency of an electrical signal that is applied to said primary coil.

13. An RFIC as in claim 11, where said electrostatic shield is patterned to form a plurality of ribbon structures, each ribbon having a width that is a function of a skin depth in the third metallization of an RE frequency of an electrical signal that is applied to said primary coil.

14. An RFIC as in claim 11, where said electrostatic shield is patterned to form a plurality of ribbon structures, each ribbon being spaced apart from an adjacent ribbon by a distance that is a function of a distance between said first metallization and said second metallization.

15. An RFIC as in claim 11, where said electrostatic shield is patterned to form a plurality of ribbon structures, each ribbon having a width that is a function of the RE frequency of an electrical signal that is applied to said primary coil and each ribbon being spaced apart from an adjacent ribbon by a distance that is a function of a distance between said first metallization and said second metallization.

16. An RFIC as in claim 11, where said electrostatic shield is patterned to form a plurality of ribbon structures, each ribbon having a width that is a function of a skin depth in the third metallization of an RE frequency of an electrical signal that is applied to said primary coil and each ribbon being spaced apart from an adjacent ribbon by a distance that is a function of a distance between said first metallization and said second metallization.

17. An RFIC as in claim 11, where said electrostatic shield is patterned to form a plurality of groups of ribbon structures, within each group the ribbon structures being electrically connected together at one point, and each group being electrically connected together at one point for being connected to the further metallization that carries the ground potential.

18. An RFIC as in claim 17, where each group of ribbon structures is electrically connected together at a point located at about a center of the patterning of the first and second metallizations.

19. An RFIC as in claim 11, further comprising a fourth layer interposed between the first layer and the second layer, said fourth layer bearing fourth metallization for defining a second electrostatic shield, the fourth metallization also being patterned into a plurality of structures having shapes intended to minimize eddy currents and being connected to still further metallization that carries a ground potential.

20. An RFIC as in claim 19, where the further metallization that carries the ground potential carries a ground potential associated with said primary coil, and where the still further metallization that carries the ground potential carries a ground potential associated with said secondary coil.

21. An RFIC as in claim 11, where the third metal is a non-ferrous metal.

22. An RFIC as in claim 11, where the RFIC is constructed using a CMOS process.

23. A radio frequency integrated circuit (RFIC) comprising a first layer bearing first electrically conductive material patterned for defining a primary coil of at least one transformer, a second layer bearing second electrically conductive material patterned for defining a secondary coil of the at least one transformer, one of the primary or the secondary coil overlying the other one of the secondary or primary coil and being magnetically coupled thereto through a third layer interposed between the first layer and the second layer, said third layer bearing third electrically conductive material for defining at least one electric shield for the at least one transformer, the third electrically conductive material being patterned into a plurality of structures having shapes intended to minimize eddy currents and being connected to further electrically conductive material that carries a ground potential.

24. An RFIC as in claim 23, where at least some of said electrically conductive material is comprised of metal.

25. An RFIC as in claim 23, where at least some of said electrically conductive material is comprised of a non-metal.

26. An RFIC as in claim 23, where said transformer is a balanced transformer, and where said at least one electric shield functions to improve the symmetry of the balanced transformer.

27. An RFIC as in claim 23, where said RFIC comprises a plurality of transformers, and where said third layer bears the third electrically conductive material for defining, for each of said plurality of transformers, at least one electric shield.

28. An RFIC as in claim 27, where said third layer further bears other electrically conductive material for coupling together at least two components of said RFIC.

* * * * *

UNITED STATES PATENT AND TRADEMARK OFFICE
CERTIFICATE OF CORRECTION

PATENT NO. : 7,084,728 B2 Page 1 of 1
APPLICATION NO. : 10/736809
DATED : August 1, 2006
INVENTOR(S) : Hyvonen It is certified that error appears in the above-identified patent and that said Letters Patent is hereby corrected as shown below:

In Claim 15, line 8, delete "RE"" and replace with --RF--.

In Claim 16, line 16, delete "RE" and replace --RF--.

Signed and Sealed this

Twenty-eighth Day of November, 2006

JON W. DUDAS
*Director of the United States Patent and Trademark Office*